United States Patent
Kusano

(10) Patent No.: US 12,378,504 B2
(45) Date of Patent: Aug. 5, 2025

(54) CLEANING SOLUTION FOR REMOVING CERIUM COMPOUND, CLEANING METHOD, AND METHOD FOR PRODUCING SEMICONDUCTOR WAFER

(71) Applicant: Mitsubishi Chemical Corporation, Tokyo (JP)

(72) Inventor: Tomohiro Kusano, Tokyo (JP)

(73) Assignee: Mitsubishi Chemical Corporation, Tokyo (JP)

(*) Notice: Subject to any disclaimer, the term of this patent is extended or adjusted under 35 U.S.C. 154(b) by 623 days.

(21) Appl. No.: 17/445,022

(22) Filed: Aug. 13, 2021

(65) Prior Publication Data

US 2021/0371776 A1 Dec. 2, 2021

Related U.S. Application Data

(63) Continuation of application No. PCT/JP2020/005988, filed on Feb. 17, 2020.

(30) Foreign Application Priority Data

Feb. 19, 2019 (JP) ................................. 2019-027048

(51) Int. Cl.
| | |
|---|---|
| C11D 3/33 | (2006.01) |
| H01L 21/304 | (2006.01) |
| H01L 21/321 | (2006.01) |

(52) U.S. Cl.
CPC .............. *C11D 3/33* (2013.01); *H01L 21/304* (2013.01); *H01L 21/3212* (2013.01); *C11D 2111/22* (2024.01)

(58) Field of Classification Search
CPC ..... C11D 3/33; C11D 2111/22; C11D 7/3245; C11D 3/0047; C11D 3/2096; C11D 3/30; C11D 7/267; C11D 7/3209; H01L 21/304; H01L 21/3212; H01L 21/02065; H01L 21/02074

See application file for complete search history.

(56) References Cited

U.S. PATENT DOCUMENTS

| | | | |
|---|---|---|---|
| 6,465,403 | B1 | 10/2002 | Skee |
| 6,585,825 | B1 | 7/2003 | Skee |
| 2014/0107008 | A1 | 4/2014 | Fu et al. |
| 2014/0264151 | A1 | 9/2014 | Ko |
| 2014/0308819 | A1 | 10/2014 | Enokido et al. |

FOREIGN PATENT DOCUMENTS

| | | | | |
|---|---|---|---|---|
| CN | 101681824 | A | 3/2010 | |
| CN | 105210176 | A | 12/2015 | |
| JP | 2011-057833 | A | 3/2011 | |
| JP | 2012-072267 | A | 4/2012 | |
| JP | 2012-117057 | A | 6/2012 | |
| JP | 5091373 | B2 * | 12/2012 | ............. A61L 15/46 |
| JP | 2014-080614 | A | 5/2014 | |
| JP | 2016-519423 | A | 6/2016 | |
| JP | 2017-107905 | A | 6/2017 | |
| TW | 201831666 | A | 9/2018 | |
| WO | WO 99/60448 | A1 | 11/1999 | |
| WO | WO 2018/136511 | A1 | 7/2018 | |

OTHER PUBLICATIONS

English Translation of JP5091373B2 (Year: 2012).*
International Search Report issued in PCT/JP2020/005988 filed on Feb. 17, 2020, 2 pages.
Extended European Search Report issued Mar. 4, 2022 in European Patent Application No. 20759018.3, 11 pages.
Combined Taiwanese Office Action and Search Report issued Aug. 9, 2023 in Taiwanese Patent Application No. 109105304 (with English Translation), 14 pages.
Notice of Reasons for Refusal issued Jan. 9, 2024 in Japanese Patent Application No. 2021-501969 (with English language translation), 6 pages.
Combined Chinese Office Action and Search Report issued Sep. 28, 2023 in Chinese Patent Application No. 202080014217.1 (with English translation), 18 pages.
Taiwanese Office Action issued on Mar. 13, 2024 in Taiwanese Patent Application No. 109105304 (with English translation), pages.
Office Action issued Jan. 22, 2025, in corresponding Korean Patent Application No. 10-2021-7025542, with English translation, 19 pages.
Taiwanese Office Action and Search Report issued Feb. 13, 2025 in corresponding Taiwanese Patent Application No. 109105304, with English Translation, 14 pages.

* cited by examiner

*Primary Examiner* — Andrew J. Oyer
(74) *Attorney, Agent, or Firm* — Oblon, McClelland, Maier & Neustadt, L.L.P.

(57) ABSTRACT

The present invention relates to a cleaning solution for removing a cerium compound, a cleaning method, and a method for producing a semiconductor wafer. An object of the present invention is to provide a cleaning solution having excellent removability of a cerium compound. The cleaning solution for removing a cerium compound of the present invention contains an aminopolycarboxylic acid compound having a coordination number of 7 or more.

16 Claims, No Drawings

CLEANING SOLUTION FOR REMOVING CERIUM COMPOUND, CLEANING METHOD, AND METHOD FOR PRODUCING SEMICONDUCTOR WAFER

TECHNICAL FIELD

The present invention relates to a cleaning solution for removing a cerium compound, a cleaning method, and a method for producing a semiconductor wafer.

BACKGROUND ART

A semiconductor wafer is produced by deposition of layers of a metal film working as a wiring and an interlayer insulating film on a silicon substrate, subsequently conducting a surface planarization by means of a chemical mechanical polishing (hereinafter referred to as "CMP") step using an abrasive composed of an aqueous slurry containing fine abrasive particles, and then stacking new layers on the planarized surface. In microfabrication of a semiconductor wafer, each layer is required to have planarity with high precision, and importance of the planarization treatment by means of CMP is very high.

In a semiconductor device producing process, in order to electrically separate an element such as a transistor, an element isolation structure by shallow trench isolation (STI) suitable for miniaturization is used instead of conventional Local Oxidation of Silicon (LOCOS). Additionally, an inter layer dielectric (ILD) is used between the wiring layers. STI and ILD are produced by forming a film of silicon dioxide using tetraethyl orthosilicate (TEOS) or the like as a raw material and planarizing the film in a CMP process.

Large quantities of abrasive fine particles of the abrasive used in the CMP step and organic residues derived from organic compounds contained in the slurry are present on the surface of the semiconductor wafer after the CMP step. Therefore, in order to remove them, the semiconductor wafer after the CMP step is subjected to a cleaning step.

In recent years, in the CMP step of silicon dioxide, cerium-based abrasive fine particles such as cerium oxide have been used in order to increase the polishing rate. However, since cerium-based abrasive fine particles form bonds with the surface of silicon dioxide during the CMP step, it is difficult to remove the abrasive fine particles in the cleaning step.

Therefore, conventionally, cleaning was performed using a strong chemical such as diluted hydrofluoric acid or a mixed liquid (SPM) of sulfuric acid and hydrogen peroxide. Various cleaning solutions have been proposed as alternative cleaning solutions to diluted hydrofluoric acid and SPM from the viewpoint of safety and waste liquid treatment. For example, Patent Literature 1 discloses a cleaning solution containing a reducing agent.

BACKGROUND ART LITERATURE

Patent Literature

Patent Literature 1: WO 2018/136511

SUMMARY OF INVENTION

Technical Problem

However, since the cleaning solution disclosed in Patent Literature 1 is acidic, the cerium compound is positively charged in the aqueous solution, while the surface of the semiconductor wafer is negatively charged, and an electrostatic attractive force acts between the cerium compound and the surface of the semiconductor wafer, the removability of the cerium compound is insufficient.

It is also conceivable to use an alkaline cleaning agent such as diluted ammonia water. By using an alkaline cleaning agent such as diluted ammonia water, the cerium compound and the surface of the semiconductor wafer are negatively charged in the aqueous solution, and an electrostatic repulsive force acts between the fine particles containing the cerium compound and the surface of the semiconductor wafer, so that reattachment of fine particles containing the cerium compound to the surface of the semiconductor wafer can be suppressed. However, an alkaline cleaning agent such as diluted ammonia water has a low ability to break the bond between the cerium compound and silicon dioxide, and the removability of the cerium compound is insufficient.

The present invention has been made in view of such a problem, and an object of the present invention is to provide a cleaning solution having excellent removability of a cerium compound.

Solution to Problem

As a result of intensive studies, the inventors of the present invention have found out a cleaning solution containing a component (A), which will be described later, and found that this cleaning solution has excellent removability of the cerium compound.

Namely, the gist of the present invention is described below.

[1] A cleaning solution for removing a cerium compound containing the following component (A):

Component (A): an aminopolycarboxylic acid compound having a coordination number of 7 or more.

[2] The cleaning solution for removing a cerium compound according to [1], wherein the component (A) is at least one compound selected from a group consisting of a compound of the following formula (1) and a compound of the following formula (2):

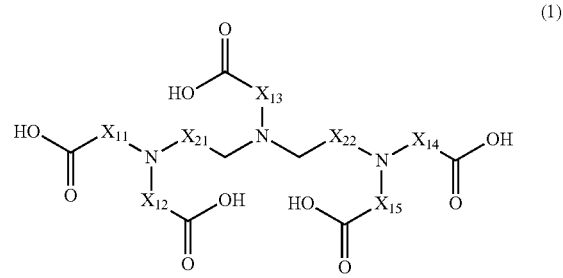

(In the above formula (1), $X_{11}$ to $X_{15}$ and $X_{21}$ to $X_{22}$ each independently represent $CH_2$, $C_2H_4$, or $C_3H_6$); and

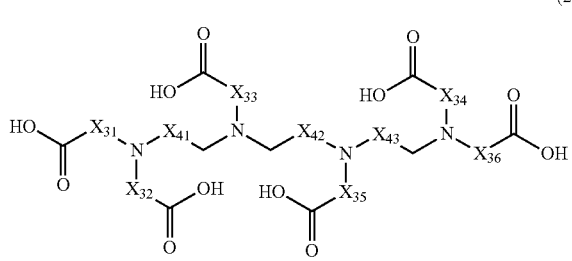

(2)

(In the above formula (2), $X_{31}$ to $X_{36}$ and $X_{41}$ to $X_{43}$ each independently represent $CH_2$, $C_2H_4$, or $C_3H_6$.).

[3] The cleaning solution for removing a cerium compound according to [1] or [2], wherein the compound of the formula (1) contains diethylenetriaminepentaacetic acid.

[4] The cleaning solution for removing a cerium compound according to any one of [1] to [3], wherein the compound of the formula (2) contains triethylenetetramine-hexaacetic acid.

[5] The cleaning solution for removing a cerium compound according to any one of [1] to [4], further containing the following component (B):

Component (B): a pH adjusting agent.

[6] The cleaning solution for removing a cerium compound according to [5], wherein the component (B) contains a quaternary ammonium hydroxide.

[7] The cleaning solution for removing a cerium compound according to any one of [1] to [6], further containing the following component (C):

Component (C): a reducing agent.

[8] The cleaning solution for removing a cerium compound according to [7], wherein the component (C) contains ascorbic acid.

[9] The cleaning solution for removing a cerium compound according to any one of [1] to [8], further containing the following component (D):

Component (D): water.

[10] The cleaning solution for removing a cerium compound according to any one of [1] to [9], which is used for cleaning after chemical mechanical polishing.

[11] The cleaning solution for removing a cerium compound according to any one of [1] to [10], which is used for cleaning a surface on which silicon dioxide is exposed.

[12] A cleaning method containing a step of removing a cerium compound using the cleaning solution for removing a cerium compound according to any one of [1] to [11].

[13] The cleaning method according to [12], further containing a step of removing a cerium compound on a semiconductor wafer.

[14] A method for producing a semiconductor wafer, including a step of removing a cerium compound using the cleaning solution for removing a cerium compound according to any one of [1] to [11].

[15] The method for producing a semiconductor wafer according to [14], further including a step of performing chemical mechanical polishing using an abrasive containing a cerium compound.

Effects of Invention

The cleaning solution of the present invention has excellent removability of a cerium compound.

In addition, the cleaning method of the present invention has excellent removability of a cerium compound.

Further, since the method for producing a semiconductor wafer of the present invention includes a cleaning step which has excellent removability of a cerium compound, it is possible to suppress an operation failure of a semiconductor device.

DESCRIPTION OF EMBODIMENTS

Although the present invention are hereunder specifically described, it should not be construed that the present invention is limited to the following embodiments, and the present invention can be carried out by making various changes within the scope of a gist thereof. In this specification, the expression "to" is used as an expression including numerical values or physical property values before and after the expression.

(Cleaning Solution)
(Component (A))

The cleaning solution of the present invention (hereinafter, may be simply referred to as "cleaning solution") is a cleaning solution for removing a cerium compound and contains the following component (A). The component (A) may be used alone or in combination of two or more.

Component (A): Aminopolycarboxylic acid compound having a coordination number of 7 or more The aminopolycarboxylic acid compound means a compound having at least one amino group and a plurality of carboxyl groups in the molecule. The amino group may be substituted.

In the present invention, the aminopolycarboxylic acid compound has a coordination number of 7 or more. The coordination number of the aminopolycarboxylic acid compound means a number of sites capable of coordinating with the metal (cerium). For example, in the case of the formula (1) to be described later, the total number of coordination of the three amino groups and the five carboxyl groups is 8, and in the case of the formula (2) to be described later, the total number of coordination of the four amino groups and the six carboxyl groups is 10.

When the coordination number of the aminopolycarboxylic acid compound is 7 or more, the coordination number of cerium ions is satisfied, and the cleaning solution of the present invention has excellent removability of the cerium compound.

Since the cleaning solution of the present invention contains an aminopolycarboxylic acid compound having a coordination number of 7 or more, the cleaning solution selectively acts on cerium ions, and can break the bond between the cerium compound and the silicon dioxide without damaging the silicon dioxide. Therefore, the cleaning solution has excellent performance in view of removability of the cerium compound and low damage to silicon dioxide.

The coordination number of the aminopolycarboxylic acid compound is preferably 8 or more from the viewpoint of the coordination ability to cerium. The coordination number of the aminopolycarboxylic acid compound is preferably 14 or less, more preferably 12 or less, and still more preferably 10 or less, from the viewpoint of the coordination ability to cerium.

Examples of the site capable of coordinating with the metal (cerium) contained in the aminopolycarboxylic acid compound include an amino group, a carboxyl group, a hydroxyl group, a phosphino group, and a thiol group. Among these, an amino group and a carboxyl group are preferred from the viewpoint of the coordination ability to cerium.

The aminopolycarboxylic acid compound having a coordination number of 7 or more is preferably at least one compound selected from the group consisting of a compound of the following formula (1) and a compound of the following formula (2) from the viewpoint of coordination ability to cerium, and more preferably at least one compound selected from the compound of the following formula (1).

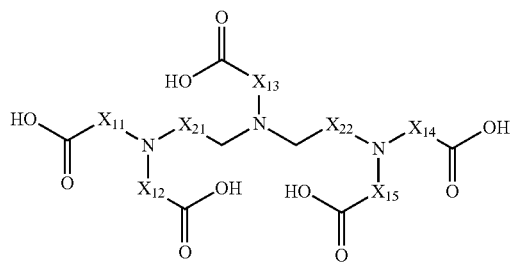
(1)

In the above formula (1), $X_{11}$ to $X_{15}$ and $X_{21}$ to $X_{22}$ each independently represent $CH_2$, $C_2H_4$, or $C_3H_6$. Additionally, preferably, $X_{11}$ to $X_{15}$ are each independently $CH_2$ and $C_2H_4$, and more preferably, $X_{11}$ to $X_{15}$ are each independently $CH_2$, from the viewpoint of the coordination ability to cerium. Preferably, $X_{21}$ to $X_{22}$ are each independently $CH_2$ and $C_2H_4$, and more preferably, $X_{21}$ to $X_{22}$ are each independently $CH_2$, from the viewpoint of the coordination ability to cerium.

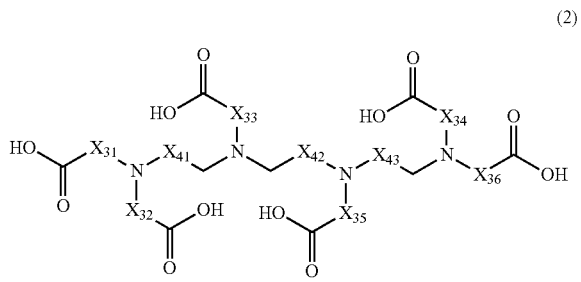
(2)

In the above formula (2), $X_{31}$ to $X_{36}$ and $X_{41}$ to $X_{43}$ each independently represent $CH_2$, $C_2H_4$, or $C_3H_6$. Preferably, $X_{31}$ to $X_{36}$ are each independently $CH_2$ and $C_2H_4$, and more preferably, $X_{31}$ to $X_{36}$ are each independently $CH_2$, from the viewpoint of the coordination ability to cerium. Preferably, $X_{41}$ to $X_{43}$ are each independently $CH_2$ and $C_2H_4$, and more preferably, $X_{41}$ to $X_{43}$ are each independently $CH_2$, from the viewpoint of the coordination ability to cerium.

Examples of the compound of the formula (1) include diethylenetriaminepentaacetic acid, dipropylenetriaminepentaacetic acid, dibutylenetriaminepentaacetic acid, and the like. Among these, from the viewpoint of coordination ability to cerium, the compound of the formula (1) preferably contains diethylenetriaminepentaacetic acid.

Examples of the compound of the formula (2) include triethylenetetramine-hexaacetic acid, tripropylenetetramine-hexaacetic acid, tributylenetetramine-hexaacetic acid, and the like. Among these, from the viewpoint of coordination ability to cerium, the compound of the formula (2) preferably contains triethylenetetramine-hexaacetic acid.

(Component (B))

Since the cleaning solution of the present invention can adjust the pH of the cleaning solution, the cleaning solution preferably contains the following component (B) in addition to the component (A).

Component (B): a pH adjusting agent

Examples of the component (B) include an acid, an alkali, and the like. Among these components (B), alkali is preferred since the zeta potential can be adjusted and the effect of the component (A) can be sufficiently exhibited.

Examples of the acid include inorganic acids, organic acids, and the like. These acids may be used alone or in combination of two or more. Among these acids, inorganic acids and organic acids are preferred since there are few metal impurities, and organic acids are more preferred.

Examples of the inorganic acids include sulfuric acid, hydrochloric acid, nitric acid, phosphoric acid, and the like. These inorganic acids may be used alone or in combination of two or more. Among these inorganic acids, sulfuric acid and phosphoric acid are preferred since sulfuric acid and phosphoric acid have low volatility, and sulfuric acid is more preferred.

Examples of the organic acid include an organic compound having an amino group, a carboxyl group, a sulfonic acid group, and a phosphonium group. These organic acids may be used alone or in combination of two or more. Among these organic acids, organic compounds having an amino group and organic compounds having a carboxyl group are preferred, and organic compounds having a carboxyl group are more preferred due to excellent chelating ability.

Examples of the alkali include an inorganic alkali, an organic alkali, and the like. One of these alkalis may be used alone or in combination of two or more. Among these alkali, inorganic alkali and organic alkali are preferred since they are easy to produce, and ammonia, quaternary ammonium hydroxide, and alkanolamine compound are more preferred since they do not contain a metal component, and the quaternary ammonium hydroxide and the alkanolamine compound are further more preferred since they can suppress the residue on the semiconductor wafer after cleaning, and tetramethylammonium hydroxide, tetraethylammonium hydroxide, ethanol amine, propanolamine, and isopropanolamine are particularly preferred.

(Component (C))

Since the cleaning solution of the present invention can reduce the cerium compound and enhance the removability of the cerium compound, the cleaning solution preferably contains the following component (C) in addition to the component (A).

Component (C): A Reducing Agent

Examples of the component (C) include L-ascorbic acid, D-ascorbic acid, isoascorbic acid, gallic acid, methyl gallate, hydrazine, hydroxylamine, thiourea dioxide, sodium hydrosulfite, and the like. These components (C) may be used alone or in combination of two or more. Among these components (C), ascorbic acid such as L-ascorbic acid, D-ascorbic acid, and isoascorbic acid are preferred, L-ascorbic acid and D-ascorbic acid are more preferred, and L-ascorbic acid is still more preferred due to excellent reducing ability.

(Component (D))

Since the cleaning solution of the present invention has excellent removability of fine particles, the cleaning solution preferably contains the following component (D) in addition to the component (A).

Component (D): Water

Examples of the water include ion exchange water, distilled water, ultrapure water, and the like. Among these, ultrapure water is preferred from the viewpoint of further enhancing the removability of the cerium compound.

(Other Components)

The cleaning solution of the present invention may contain other components than the components (A) to (D) as long as the effects of the present invention are not impaired.

Examples of other components include a surfactant, an etching inhibitor, and the like.

(Physical Properties of Cleaning Solution)

The pH of the cleaning solution is preferably from 9 to 14, more preferably from 10 to 13.5, and further more preferably from 11 to 13. When the pH is 9 or more, the hydrogen ions derived from the component (A) are sufficiently dissociated, the effect of the component (A) can be sufficiently exhibited, and also the fine particles containing the cerium compound and the surface of the semiconductor wafer are negatively charged, and reattachment of the fine particles containing the cerium compound to the surface of the semiconductor wafer can be suppressed. When the pH is 14 or less, damage to the semiconductor wafer can be suppressed.

(Mass Ratio of Each Component)

When the cleaning solution of the present invention contains the component (B), a mass ratio of the component (A) to the component (B) (the mass of the component (A)/the mass of the component (B)) is preferably from 0.1 to 60, and more preferably from 0.2 to 10. When the mass ratio of the component (A) to the component (B) is 0.1 or more, the cleaning solution has excellent removability of the cerium compound. When the mass ratio of the component (A) to the component (B) is 60 or less, the pH of the cleaning solution can be easily adjusted.

When the cleaning solution of the present invention contains the component (C), a mass ratio of the component (A) to the component (C) (the mass of the component (A)/the mass of the component (C)) is preferably from 1 to 200, and more preferably from 5 to 150. When the mass ratio of the component (A) to the component (C) is 1 or more, the cleaning solution has excellent removability of the cerium compound. When the mass ratio of the component (A) to the component (C) is 200 or less, the cleaning solution has more excellent removability of the cerium compound.

When the cleaning solution of the present invention contains the component (B) and the component (C), a mass ratio of the component (C) to the component (B) (the mass of the component (C)/the mass of the component (B)) is preferably from 0.01 to 5, and more preferably from 0.05 to 1. When the mass ratio of the component (C) to the component (B) is 0.01 or more, the cleaning solution has excellent removability of the cerium compound. When the mass ratio of the component (C) to the component (B) is 5 or less, the pH of the cleaning solution can be easily adjusted.

(Content of Each Component in Cleaning Solution)

A content (% by mass) of the component (A) is preferably from 0.001% by mass to 30% by mass, more preferably from 0.005% by mass to 20% by mass, and still more preferably from 0.01% by mass to 15% by mass, based on 100% by mass of the cleaning solution. When the content of the component (A) is 0.001% by mass or more, the cleaning solution has excellent removability of the cerium compound. When the content of the component (A) is 30% by mass or less, the component (A) can be dissolved in the component (D), and the production cost of the cleaning solution can be suppressed.

The content (mmol/L) of the component (A) is preferably from 0.025 mmol/L to 750 mmol/L, more preferably from 0.125 mmol/L to 500 mmol/L, and still more preferably from 0.25 mmol/L to 375 mmol/L. When the content of the component (A) is 0.025 mmol/L or more, the cleaning solution has more excellent removability of the cerium compound. When the content of the component (A) is 750 mmol/L or less, the component (A) can be dissolved in the component (D), and the production cost of the cleaning solution can be suppressed.

When the cleaning solution of the present invention contains the component (B), a content of the component (B) is preferably from 0.001% by mass to 30% by mass, more preferably from 0.005% by mass to 20% by mass, and still more preferably from 0.01% by mass to 15% by mass, based on 100% by mass of the cleaning solution. When the content of the component (B) is 0.001% by mass or more, the pH of the cleaning solution can be easily adjusted. When the content of the component (B) is 30% by mass or less, the pH of the cleaning solution can be adjusted without impairing the effect of the present invention.

When the cleaning solution of the present invention contains the component (C), a content of the component (C) is preferably from 0.0005% by mass to 10% by mass, more preferably from 0.001% by mass to 5% by mass, and still more preferably from 0.002% by mass to 2.5% by mass, based on 100% by mass of the cleaning solution. When the content of the component (C) is 0.0005% by mass or more, the cleaning solution has more excellent removability of the cerium compound. When the content of the component (C) is 10% by mass or less, the component (C) can be dissolved in the component (D), and the production cost of the cleaning solution can be suppressed.

When the cleaning solution of the present invention contains other components, a content of the other components is preferably 20% by mass or less, more preferably from 0.001% by mass to 10% by mass, and still more preferably from 0.01% by mass to 5% by mass, based on 100% by mass of the cleaning solution. When the content of the other component is 20% by mass or less, the effects of the other components can be imparted without impairing the effect of the present invention.

When the cleaning solution of the present invention contains the component (D), a content of the component (D) is preferably the balance of the components (components (A) to (C) and other components) other than the component (D).

(Method for Producing Cleaning Solution)

The method for producing the cleaning solution of the present invention is not particularly limited, and the cleaning solution can be produced by mixing the component (A) and, if necessary, the components (B) to (D), and other components.

The order of mixing is not particularly limited, and all of the components may be mixed at one time, or some components may be mixed in advance and then the remaining components may be mixed.

In the method for producing the cleaning solution of the present invention, each component may be mixed so as to have a content suitable for cleaning. However, since it is possible to suppress cost such as transportation and storage, a cleaning solution containing components other than the component (D) at a high content rate may be prepared, and then diluted with the component (D) before cleaning to prepare a cleaning solution.

Although the dilution ratio can be appropriately set depending on the object to be cleaned, the dilution ratio is preferably from 30 times to 150 times, and more preferably from 40 times to 120 times.

(Object to be Cleaned)

Examples of the objects to be cleaned of the cleaning solution of the present invention include semiconductor wafers, glass, metals, ceramics, resins, magnetic materials, superconductors, and the like. Among these objects to be cleaned, since the effects of the present invention are remarkably excellent, a cleaning object having a surface on which silicon dioxide is exposed is preferred, and a semiconductor wafer having a surface on which silicon dioxide is exposed is more preferred.

In addition to silicon dioxide, silicon nitride or metal may coexist on the surface of the semiconductor wafer having a surface on which silicon dioxide is exposed.

(Type of Cleaning Step)

Since the cleaning solution of the present invention has excellent removability of the cerium compound, the cleaning solution can be suitably used for cleaning after chemical mechanical polishing.

The chemical mechanical polishing (CMP) step refers to a step of mechanically processing and planarizing the surface of a semiconductor wafer. In general, in the CMP step, using a dedicated device, a back side of the semiconductor wafer is attached to a jig called platen, and the surface of the semiconductor wafer is pressed against a polishing pad, and an abrasive containing abrasive particles is dropped onto the polishing pad to polish the surface of the semiconductor wafer.

(CMP)

The CMP is performed by rubbing the object to be polished against the polishing pad with using an abrasive.

The abrasive is not particularly limited as long as the abrasive is insoluble in water and can polish the object to be polished. However, since the effect of the cleaning solution of the present invention can be sufficiently exhibited, the abrasive fine particles are preferred, and the abrasive fine particles of the cerium compound are more preferred.

The abrasive fine particles may contain colloidal silica ($SiO_2$), fumed silica ($SiO_2$), or alumina ($Al_2O_3$) in addition to the abrasive fine particles of the cerium compound.

Examples of the cerium compound include cerium oxide, cerium hydroxide, and the like. These cerium compounds may be used alone or in combination of two or more. Among these cerium compounds, cerium oxide and cerium hydroxide are preferred, and cerium oxide is more preferred due to excellent polishing rate and low scratch property.

The abrasive may contain additives such as an oxidizing agent and a dispersant in addition to the abrasive fine particles. In particular, in CMP in a semiconductor wafer having a surface on which a metal is exposed, a metal is likely to be corroded, and thus an anticorrosive agent is often included.

When the cleaning solution of the present invention is applied to a semiconductor wafer having a surface on which silicon dioxide is exposed after polishing with an abrasive containing abrasive fine particles of such a cerium compound, contamination of the semiconductor wafer derived from the cerium compound can be removed extremely effectively.

(Cleaning Conditions)

The method for cleaning the object to be cleaned is preferably a method of bringing the cleaning solution of the present invention into direct contact with the object to be cleaned.

As a method of bringing the cleaning solution of the present invention into direct contact with the object to be cleaned, for example, a dipping method in which a cleaning tank is filled with the cleaning solution of the present invention to immerse the object to be cleaned; a spin method for rotating the object to be cleaned at high speed with allowing the cleaning solution of the present invention to flow from a nozzle onto the object to be cleaned; and a spray method for spraying and cleaning the cleaning solution of the present invention on the object to be cleaned. Among these methods, the spin method and the spray method are preferred since more efficient decontamination can be performed in a short time.

Examples of an apparatus for performing such cleaning include a batch cleaning apparatus for simultaneously cleaning a plurality of objects to be cleaned which are accommodated in a cassette, a single wafer cleaning apparatus for mounting a single object to be cleaned on a holder and performing cleaning, and the like. Among these apparatuses, a single wafer cleaning apparatus is preferred due to excellent cleaning ability.

The method for cleaning an object to be cleaned is preferably performed by physical force since the removability of fine particles attached to the object to be cleaned is further improved and the cleaning time can be shortened. The scrub cleaning using a cleaning brush and the ultrasonic cleaning with a frequency of 0.5 megahertz or more is more preferred, and scrub cleaning using a resin brush is further more preferred since the scrub cleaning using the resin brush is more suitable for cleaning after the CMP step.

Although the material of the resin brush is not particularly limited, polyvinyl alcohol or polyvinyl formal is preferred due to easy production of the resin brush itself.

The cleaning temperature may be room temperature, and may be heated to 30° C. to 70° C. as long as the performance of the semiconductor wafer is not impaired.

(Cleaning Method)

The cleaning method of the present invention is a method including a step of removing a cerium compound (for example, a cerium compound on a semiconductor wafer) using the cleaning solution of the present invention, and is as described above.

(Method for Producing Semiconductor Wafer)

The method for producing a semiconductor wafer of the present invention is a method including a step of removing a cerium compound by using the cleaning solution of the present invention, and as described above, preferably includes a step of performing chemical mechanical polishing using an abrasive containing a cerium compound.

EXAMPLES

Hereinafter, the present invention will be described more specifically with reference to Examples. However, the present invention is not limited to the description of the following Examples as long as they do not depart from the gist of the present invention.

(Raw Materials)

Component (A-1): Diethylenetriaminepentaacetic acid (manufactured by Tokyo Chemical Industry Co., Ltd.)

Component (A-2): Triethylenetetramine-hexaacetic acid (manufactured by Tokyo Chemical Industry Co., Ltd.)

Component (A'-1): Monoethanolamine (manufactured by Tokyo Chemical Industry Co., Ltd.)

Component (B-1): Tetraethylammonium hydroxide (manufactured by Tokyo Chemical Industry Co., Ltd.)

Component (C-1): L-ascorbic acid (manufactured by Tokyo Chemical Industry Co., Ltd.)

Component (D-1): Water (pH Measurement)

The pH of the cleaning solutions obtained in Examples 1 to 6 and Comparative Examples 1 to 2 was measured by a pH meter (model name "D-74", manufactured by Horiba, Ltd.) with stirring using a magnetic stirrer.

(Measurement of Residual Amount of Cerium Oxide)

A silicon substrate on which a silicon dioxide film was formed by a plasma chemical vapor deposition (CVD) method using tetraethoxysilane (TEOS) was cut into a size of 30 mm×30 mm. Next, the silicon substrate was subjected to chemical mechanical polishing (CMP) for 30 seconds using an abrasive containing cerium oxide (aqueous dispersion of cerium oxide fine particles having a particle diameter of 200 nm or less) and a polishing pad (trade name "IC1000", manufactured by Nitta Haas Co., Ltd.).

Next, the silicon substrate was put in the cleaning solutions obtained in Examples 1 to 6 and Comparative Examples 1 to 2 and ultrasonically cleaned for 5 minutes. Next, the silicon substrate was rinsed with water and dried, and the amount of cerium oxide remaining on the surface of the silicon substrate ($\mu g/cm^2$) was measured using an X-ray fluorescence analyzer (model name "ZSX100e", manufactured by Rigaku Corporation).

Example 1

In 100% by mass of the cleaning solution, the components were mixed such that the component (A-1) was 0.39% by mass, the component (B-1) was 0.88% by mass, and the balance was the component (D-1), and a cleaning solution was obtained.

The evaluation results of the obtained cleaning solution are shown in Table 1.

Examples 2 to 6 and Comparative Examples 1 to 2

A cleaning solution was obtained in the same manner as in Example 1, except that the type and content of the raw materials were as shown in Table 1.

The evaluation results of the obtained cleaning solution are shown in Table 1.

As can be seen from Table 1, the cleaning solutions obtained in Examples 1 to 6 containing the component (A) could suppress the residual amount of cerium oxide.

On the other hand, since the cleaning solutions obtained in Comparative Examples 1 and 2 did not contain the component (A), the residual amount of cerium oxide could not be suppressed.

Although the present invention are described in detail with reference to the specific embodiment, it will be apparent to those skilled in the art that various changes and modifications can be made without departing from the spirit and scope of the present invention. The present application is based on a Japanese Patent Application (Japanese Patent Application No. 2019-27048) filed on Feb. 19, 2019, and the content thereof is incorporated herein as reference.

INDUSTRIAL APPLICABILITY

Since the cleaning solution of the present invention has excellent removability of a cerium compound, the cleaning solution can be suitably used for cleaning after chemical mechanical polishing.

The invention claimed is:

1. A cleaning solution, consisting of:
   an aminopolycarboxylic acid compound having a coordination number of 7 or more;
   water;
   a pH adjusting agent comprising a quaternary ammonium hydroxide; and
   optionally a reducing agent.

2. The cleaning solution according to claim 1, wherein the aminopolycarboxylic acid compound includes at least one selected from the group consisting of
   a compound of the following formula (1):

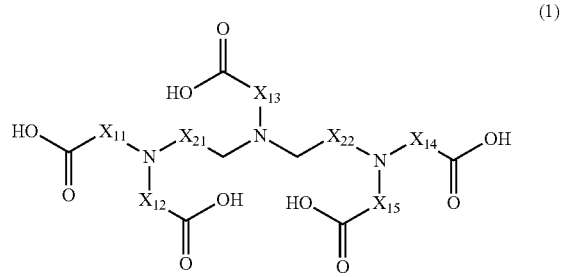

TABLE 1

| | Component (A) | | | Component (B) | | Component (C) | | | Residual Amount of Cerium Oxide ($\mu g/cm^2$) |
|---|---|---|---|---|---|---|---|---|---|
| | Type | Content (% by mass) | Molar Concentration (mmol/L) | Type | Content (% by mass) | Type | Content (% by mass) | pH | |
| Example 1 | (A-1) | 0.39 | 10 | (B-1) | 0.88 | — | — | 12.2 | 0.79 |
| Example 2 | (A-1) | 0.39 | 10 | (B-1) | 0.96 | (C-1) | 0.09 | 12.0 | 0.14 |
| Example 3 | (A-1) | 0.39 | 10 | (B-1) | 0.66 | — | — | 11.0 | 1.28 |
| Example 4 | (A-1) | 0.08 | 2 | (B-1) | 0.29 | — | — | 12.1 | 1.15 |
| Example 5 | (A-1) | 0.20 | 5 | (B-1) | 0.52 | — | — | 12.1 | 0.97 |
| Example 6 | (A-2) | 0.25 | 5 | (B-1) | 0.59 | — | — | 12.0 | 0.87 |
| Comparative Example 1 | — | — | — | (B-1) | 0.15 | — | — | 12.1 | 1.84 |
| Comparative Example 2 | (A'-1) | 0.03 | 5 | (B-1) | 0.22 | — | — | 12.0 | 1.39 | wherein $X_{11}$, $X_{12}$, $X_{13}$, $X_{14}$, $X_{15}$, $X_{21}$, and $X_{22}$ each independently represent $CH_2$, $C_2H_4$, or $C_3H_6$ and a compound of the following formula (2):

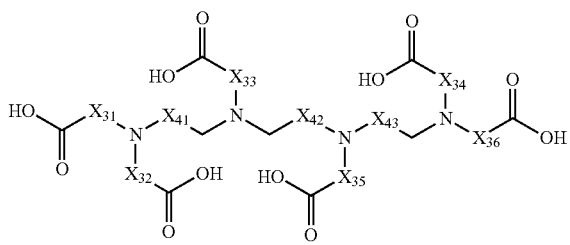

(2)

wherein $X_{31}$, $X_{32}$, $X_{33}$, $X_{34}$, $X_{35}$, $X_{36}$, $X_{41}$, $X_{42}$, and $X_{43}$ each independently represent $CH_2$, $C_2H_4$, or $C_3H_6$.

3. The cleaning solution according to claim 2, wherein the aminopolycarboxylic acid compound comprises the compound of the formula (1) which comprises diethylenetriaminepentaacetic acid.

4. The cleaning solution according to claim 2, wherein the aminopolycarboxylic acid compound comprises the compound of the formula (2) which comprises triethylenetetramine-hexaacetic acid.

5. The cleaning solution according to claim 1, further comprising: the reducing agent.

6. The cleaning solution according to claim 5, wherein the reducing agent comprises ascorbic acid.

7. The cleaning solution according to claim 1, wherein the coordination number of the aminopolycarboxylic acid compound is 8 or more, and 14 or less.

8. The cleaning solution according to claim 1, wherein the cleaning solution has a pH of 9 to 14.

9. The cleaning solution according to claim 1, wherein the aminopolycarboxylic acid is present from 0.001% to 30% by mass based on a total mass of the cleaning solution.

10. The cleaning solution according to claim 1, wherein the pH adjusting agent is present from 0.001% to 30% by mass based on a total mass of the cleaning solution.

11. The cleaning solution according to claim 1, wherein the reducing agent is present from 0.0005% to 10% by mass based on a total mass of the cleaning solution.

12. The cleaning solution according to claim 1, wherein the pH adjusting agent is present from 20% to 30% by mass based on a total mass of the cleaning solution.

13. A cleaning method, comprising:
removing a cerium compound using the cleaning solution of claim 1.

14. The cleaning method according to claim 13, wherein the cerium compound is removed from a semiconductor wafer.

15. A method for producing a semiconductor wafer, comprising removing a cerium compound using the cleaning solution of claim 1.

16. The method according to claim 15, further comprising performing chemical mechanical polishing using an abrasive containing the cerium compound.

* * * * *